United States Patent
Kim et al.

(10) Patent No.: US 9,343,502 B2
(45) Date of Patent: May 17, 2016

(54) ORGANIC PHOTOELECTRONIC DEVICE INCLUDING A FIRST LIGHT-TRANSMITTING ELECTRODE, AN ACTIVE LAYER, AND A SECOND LIGHT-TRANSMITTING ELECTRODE, AND IMAGE SENSOR INCLUDING THE ORGANIC PHOTOELECTRONIC DEVICE

(71) Applicant: Samsung Electronics Co., Ltd., Suwon-Si, Gyeonggi-Do (KR)

(72) Inventors: Kyu Sik Kim, Yongin-si (KR); Ryuichi Satoh, Shizuoka (JP); Kyung Bae Park, Hwaseong-si (KR); Chul Joon Heo, Busan (KR); Yong Wan Jin, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/336,439

(22) Filed: Jul. 21, 2014

(65) Prior Publication Data

US 2015/0188064 A1  Jul. 2, 2015

(30) Foreign Application Priority Data

Jan. 2, 2014  (KR) .................. 10-2014-0000365

(51) Int. Cl.

| H01L 27/146 | (2006.01) |
|---|---|
| H01L 51/44 | (2006.01) |
| H01L 27/30 | (2006.01) |
| H01L 51/00 | (2006.01) |
| H01L 51/42 | (2006.01) |

(52) U.S. Cl.
CPC .... *H01L 27/14645* (2013.01); *H01L 27/14609* (2013.01); *H01L 27/14621* (2013.01); *H01L 27/14625* (2013.01); *H01L 27/14643* (2013.01); *H01L 51/442* (2013.01); *H01L 27/307* (2013.01); *H01L 51/0068* (2013.01); *H01L 51/4273* (2013.01); *H01L 2251/305* (2013.01); *H01L 2251/306* (2013.01); *H01L 2251/308* (2013.01)

(58) Field of Classification Search
CPC ................... H01L 27/14643; H01L 27/14645; H01L 27/14647; H01L 27/14667; H01L 27/146; H01L 31/02162; H01L 31/02167
USPC ......................................... 257/290, 291, 294
See application file for complete search history.

(56) References Cited

U.S. PATENT DOCUMENTS

| 7,655,961 B2 | 2/2010 | Marrocco, III et al. |
| 2005/0217722 A1 | 10/2005 | Komatsu et al. |
| 2008/0230123 A1* | 9/2008 | Mitsui et al. .................. 136/263 |

(Continued)

FOREIGN PATENT DOCUMENTS

KR   20130012431 A   2/2013

*Primary Examiner* — Minh-Loan Tran
(74) *Attorney, Agent, or Firm* — Harness, Dickey & Pierce, P.L.C.

(57) ABSTRACT

Disclosed are an organic photoelectronic device including a first light-transmitting electrode, an active layer positioned on one side of the first light-transmitting electrode, and a second light-transmitting electrode positioned on one side of the active layer, wherein the first light-transmitting electrode and the second light-transmitting electrode independently comprise at least one of indium tin oxide (ITO), indium zinc oxide (IZO), tin oxide (SnO), aluminum tin oxide (ATO), aluminum zinc oxide (AZO), and fluorine-doped tin oxide (FTO). Also disclosed is an image sensor including the organic photoelectronic device.

17 Claims, 11 Drawing Sheets

(56) References Cited

U.S. PATENT DOCUMENTS

| | | | |
|---|---|---|---|
| 2011/0001128 A1* | 1/2011 | Kim et al. | 257/40 |
| 2011/0309462 A1* | 12/2011 | Sargent et al. | 257/443 |
| 2013/0026454 A1 | 1/2013 | Lee et al. | |
| 2013/0087682 A1* | 4/2013 | Nomura | 250/206 |
| 2013/0105768 A1 | 5/2013 | Leem et al. | |

\* cited by examiner

ORGANIC PHOTOELECTRONIC DEVICE INCLUDING A FIRST LIGHT-TRANSMITTING ELECTRODE, AN ACTIVE LAYER, AND A SECOND LIGHT-TRANSMITTING ELECTRODE, AND IMAGE SENSOR INCLUDING THE ORGANIC PHOTOELECTRONIC DEVICE

This application claims priority from Korean Patent Application No. 10-2014-0000365 filed in the Korean Intellectual Property Office on Jan. 2, 2014, the entire contents of which are incorporated herein by reference.

BACKGROUND

1. Field

An organic photoelectronic device and an image sensor including the same are disclosed.

2. Description of the Related Art

A photoelectronic device converts light into an electrical signal using photoelectronic effects, and may include a photodiode, a phototransistor, and the like, and may be applied to an image sensor, a solar cell, and the like.

An image sensor including a photodiode requires high resolution and thus a small pixel. At present, silicon photodiodes are widely used, but present a problem of deteriorated sensitivity because of a small absorption area due to small pixels. Accordingly, an organic material that is capable of replacing silicon has been researched.

The organic material has a high extinction coefficient and selectively absorbs light in a particular wavelength region depending on a molecular structure, and thus may simultaneously replace a photodiode and a color filter and resultantly improve sensitivity and contribute to high integration.

In order to implement a photodiode using the organic material, loss of incident light is required to be decreased and photoelectric conversion efficiency is required to be ensured. In addition, when the photodiode is applied to an image sensor, the photodiode may have a low leakage current and may sense a current value generated by light, and thus increase sensing performance.

SUMMARY

At least one example embodiment provides an organic photoelectronic device that is capable of reducing loss of incident light, ensuring photoelectric conversion efficiency, and decreasing a leakage current.

Another example embodiment provides an image sensor including the organic photoelectronic device.

According to at least one example embodiment, an organic photoelectronic device includes a first light-transmitting electrode, an active layer positioned on one side of the first light-transmitting electrode, and a second light-transmitting electrode positioned on one side of the active layer, wherein the first light-transmitting electrode and the second light-transmitting electrode independently include at least one of indium tin oxide (ITO), indium zinc oxide (IZO), tin oxide (SnO), aluminum tin oxide (ATO), aluminum zinc oxide (AZO), and fluorine-doped tin oxide (FTO).

The first light-transmitting electrode may be positioned at a light incidence side.

The first light-transmitting electrode may have a thickness of about 1 nm to about 100 nm.

The first light-transmitting electrode may have a thickness of about 2 nm to about 10 nm.

The organic photoelectronic device may further include a buffer layer positioned between the first light-transmitting electrode and the active layer, the buffer layer including an inorganic oxide.

The buffer layer may contact the first light-transmitting electrode.

The buffer layer may include molybdenum oxide, tungsten oxide, tin oxide, vanadium oxide, rhenium oxide, niobium oxide, tantalum oxide, titanium oxide, nickel oxide, copper oxide, cobalt oxide, manganese oxide, chromium oxide, or a combination thereof.

The buffer layer may have a thickness of about 1 nm to about 30 nm.

The active layer may selectively absorb light of a green wavelength region.

The active layer may include a p-type semiconductor material having a maximum absorption peak in a wavelength region of about 500 nm to about 600 nm, and an n-type semiconductor material having a maximum absorption peak in a wavelength region of about 500 nm to about 600 nm.

The active layer may selectively absorb light of a red wavelength region.

The active layer may selectively absorb light of a red wavelength region.

According to another example embodiment, an image sensor including the organic photoelectronic device is provided.

According to another example embodiment, an image sensor includes a green pixel, a red pixel, and a blue pixel, wherein the green pixel includes the organic photoelectronic device and a green photo-sensing device electrically connected to the organic photoelectronic device, the red pixel includes a red filter and a red photo-sensing device, and the blue pixel includes a blue filter and a blue photo-sensing device.

The image sensor may further include a metal wire positioned on each of the green photo-sensing device, the red photo-sensing device, and the blue photo-sensing device.

The image sensor may further include a metal wire positioned under each of the green photo-sensing device, the red photo-sensing device, and the blue photo-sensing device.

According to another example embodiment, an image sensor includes a green pixel, a red pixel, and a blue pixel, wherein the green pixel includes the organic photoelectronic device and a green photo-sensing device electrically connected to the organic photoelectronic device, the red pixel includes a second organic photoelectronic device and a red photo-sensing device electrically connected to the second organic photoelectronic device, and the blue pixel includes a third organic photoelectronic device and a blue photo-sensing device electrically connected to the third organic photoelectronic device.

The first organic photoelectronic device may be positioned on the second organic photoelectronic device and the third organic photoelectronic device.

The image sensor may further include a metal wire positioned on each of the green photo-sensing device, the red photo-sensing device, and the blue photo-sensing device.

The image sensor may further include a metal wire positioned under each of the green photo-sensing device, the red photo-sensing device, and the blue photo-sensing device.

DETAILED DESCRIPTION

Example embodiments will hereinafter be described in detail, and may be easily performed by those who have common knowledge in the related art. However, this disclosure may be embodied in many different forms and is not construed as limited to the example embodiments set forth herein.

As used herein, when a definition is not otherwise provided, the term "substituted" refers to one substituted with a substituent selected from a halogen atom (F, Br, Cl, or I), a hydroxy group, an alkoxy group, a nitro group, a cyano group, an amino group, an azido group, an amidino group, hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof, instead of hydrogen of a compound.

As used herein, when specific definition is not otherwise provided, the term "hetero" refers to one including 1 to 3 heteroatoms selected from N, O, S, and P.

In the drawings, the thickness of layers, films, panels, regions, etc., are exaggerated for clarity. Like reference numerals designate like elements throughout the specification.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.\Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

Hereinafter, an organic photoelectronic device according to one example embodiment is described referring to FIG. 1.

Figure 1:
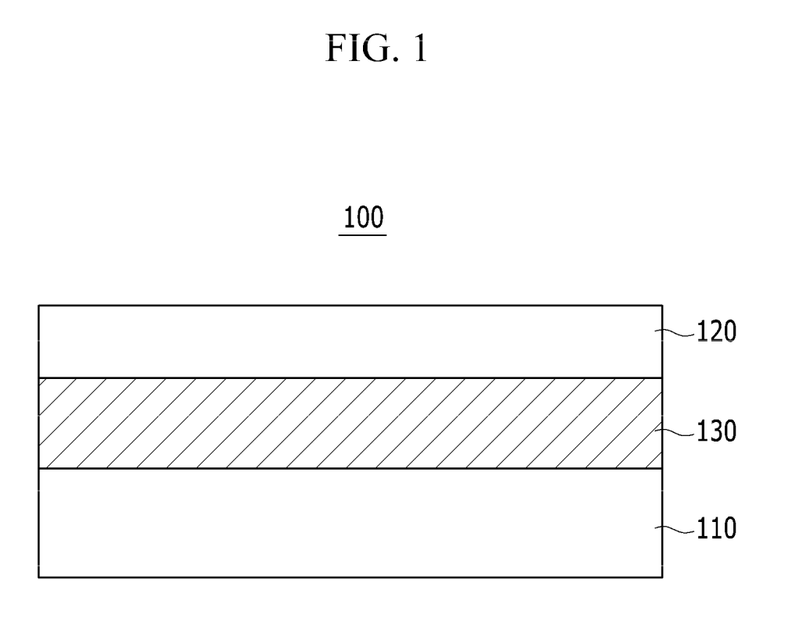
FIG. 1 is a cross-sectional view of an organic photoelectronic device according to at least one example embodiment.

FIG. 1 is a cross-sectional view showing an organic photoelectronic device according to at least one example embodiment.

Referring to FIG. 1, an organic photoelectronic device 100 according to at least one example embodiment includes a first light-transmitting electrode 120, an active layer 130 positioned on one side of the first light-transmitting electrode 120, and a second light-transmitting electrode 110 positioned on one side of the active layer 130.

According to at least one example embodiment, the first light-transmitting electrode 120 is a front side electrode positioned at a light-incident side, and the second light-transmitting electrode 110 is a back side electrode facing the first light-transmitting electrode 120. Either of the first light-transmitting electrode 120 and the second light-transmitting electrode 110 is an anode, while the other is a cathode.

According to at least one example embodiment, the first light-transmitting electrode 120 is a transparent electrode transmitting light, and may include at least one of indium tin oxide (ITO), indium zinc oxide (IZO), tin oxide (SnO), aluminum tin oxide (ATO), aluminum zinc oxide (AZO), and fluorine-doped tin oxide (FTO).

The indium tin oxide (ITO), indium zinc oxide (IZO), tin oxide (SnO), aluminum tin oxide (ATO), aluminum zinc oxide (AZO), and fluorine-doped tin oxide (FTO) are transparent conductors showing transmittance of greater than or equal to about 85% regardless of a wavelength in a visible ray region ranging from about 400 nm to 700 nm, and when used in the first light-transmitting electrode 120 as a front side electrode, the transparent conductor may decrease loss of incident light. The first light-transmitting electrode 120 may decrease incident light loss, and in particular, may largely decrease incident light loss in a long wavelength region compared with a thin film electrode formed by using a metal such as silver (Ag) and/or aluminum (Al) or by co-depositing these metals with an inorganic oxide.

In addition, the indium tin oxide (ITO), indium zinc oxide (IZO), tin oxide (SnO), aluminum tin oxide (ATO), aluminum zinc oxide (AZO), and fluorine-doped tin oxide (FTO) have a low surface reflectance and thus may decrease reflection of incident light on the surface of the first transparent electrode 120, and may thus further increase light absorption.

The indium tin oxide (ITO), indium zinc oxide (IZO), tin oxide (SnO), aluminum tin oxide (ATO), aluminum zinc oxide (AZO), and fluorine-doped tin oxide (FTO) may be, for example, sputtered, and the sputtering process may be controlled to decrease damage to the active layer 130 underneath the electrode 120. For example, the sputtering may be performed at a speed of about 0.05 Å/s to about 100 Å/s for about 30 seconds to 30 minutes. Specifically, the sputtering may be performed at a speed of about 0.05 Å/s to about 10 Å/s, and more specifically, at a speed of about 0.05 Å/s to about 5 Å/s.

The first light-transmitting electrode 120 may have a thickness of about 1 nm to about 100 nm, specifically a thickness of about 2 nm to about 30 nm, and more specifically a thickness of about 2 nm to about 10 nm within the range. When the first light-transmitting electrode 120 is formed to be thin as aforementioned, transmittance and conductivity are not only secured, but damage to the active layer 130 may be effectively prevented during the sputtering process.

The active layer 130 is a layer where p-type and n-type semiconductor materials form a pn flat junction or a bulk heterojunction. The active layer 130 may be formed as a single layer or multilayer, and plays a role of receiving light entering through the first light-transmitting electrode 120, producing an exciton, and then separating the exciton into a hole and an electron.

The p-type and n-type semiconductor materials respectively absorb light of a green wavelength region, and may show a maximum absorption peak in a wavelength region of about 500 nm to 600 nm.

The p-type and n-type semiconductor materials may respectively have a bandgap of about 1.5 eV to about 3.5 eV, and specifically, about 2.0 eV to about 2.5 eV.

The p-type and n-type semiconductor materials having a bandgap within the range may absorb light of a green wavelength region and show a maximum absorption peak specifically in a wavelength region of about 500 nm to about 600 nm.

The p-type and n-type semiconductor materials may have a full width at half maximum (FWHM) ranging from about 50 nm to about 150 nm in an absorbance curve. Herein, the FWHM is a width of a wavelength region corresponding to a half of a maximum absorbance point, and a smaller FWHM indicates selective absorbance of light of a narrow wavelength region and high wavelength selectivity. Accordingly, a material having FWHM within the above-discussed range of about 50 nm to about 150 nm may have high selectivity for a green wavelength region.

The p-type semiconductor material and the n-type semiconductor material may have a lowest unoccupied molecular orbital (LUMO) energy level difference of about 0.2 to about 0.7 eV, and specifically about 0.3 to about 0.5 eV. When the p-type semiconductor material and the n-type semiconductor material in the active layer 130 have a LUMO energy level difference within the above-discussed range, external quantum efficiency (EQE) may be improved and effectively adjusted depending on a bias applied thereto.

The p-type semiconductor material may include, for example, a compound such as N,N-dimethyl-quinacridone (DMQA) and a derivative thereof, diindenoperylene, dibenzo{[f,f]-4,4',7,7'-tetraphenyl}diindeno[1,2,3-cd:1',2'', 3'-lm]perylene, but is not limited thereto. The n-type semiconductor material may include, for example, a compound such as dicyanovinyl-terthiophene (DCV3T) and a derivative thereof, perylene diimide, phthalocyanine and a derivative thereof, sub-phthalocyanine and a derivative thereof, boron dipyrromethene (BODIPY) and a derivative thereof, but is not limited thereto.

Herein, the p-type and n-type semiconductor materials are respectively illustrated as a case of absorbing light of a green wavelength region, but are not limited thereto, and may selectively absorb light of a blue wavelength region or light of a red wavelength region.

The active layer 130 may be a single layer or a multilayer. The active layer 130 may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor material and the n-type semiconductor material in a ratio of about 1:100 to about 100:1. The materials may be included in a ratio ranging from about 1:50 to about 50:1 within the range, specifically, about 1:10 to about 10:1, and more specifically, about 1:1. When the p-type and n-type semiconductor materials have a composition ratio within any of the above-discussed ranges, an exciton may be effectively produced, and a pn junction may be effectively formed.

The p-type layer may include the p-type semiconductor material, and the n-type layer may include the n-type semiconductor material.

The active layer 130 may have a thickness of about 1 nm to about 500 nm, and specifically about 5 nm to about 300 nm. When the active layer 130 has a thickness within the above ranges, the active layer may effectively absorb light, effectively separate holes from electrons, and transport electrons, thereby effectively improving photoelectric conversion efficiency.

The second light-transmitting electrode 110 is a transparent electrode passing light, and may include at least one of indium tin oxide (ITO), indium zinc oxide (IZO), tin oxide (SnO), aluminum tin oxide (ATO), and fluorine-doped tin oxide (FTO), or a metal thin film electrode.

In the organic photoelectronic device 100, when light is incident from the first light-transmitting electrode 120, and when the active layer 130 adsorbs light having a predetermined wavelength region, excitons may be produced from the inside. The excitons are separated into holes and electrons in the active layer 130, and the separated holes are transported to an anode that is one of the first light-transmitting electrode 120 and the second light-transmitting electrode 110, and the separated electrons are transported to the cathode that is the other of the first light-transmitting electrode 120 and the second light-transmitting electrode 110 so as to flow a current in the organic photoelectronic device.

Figure 2:
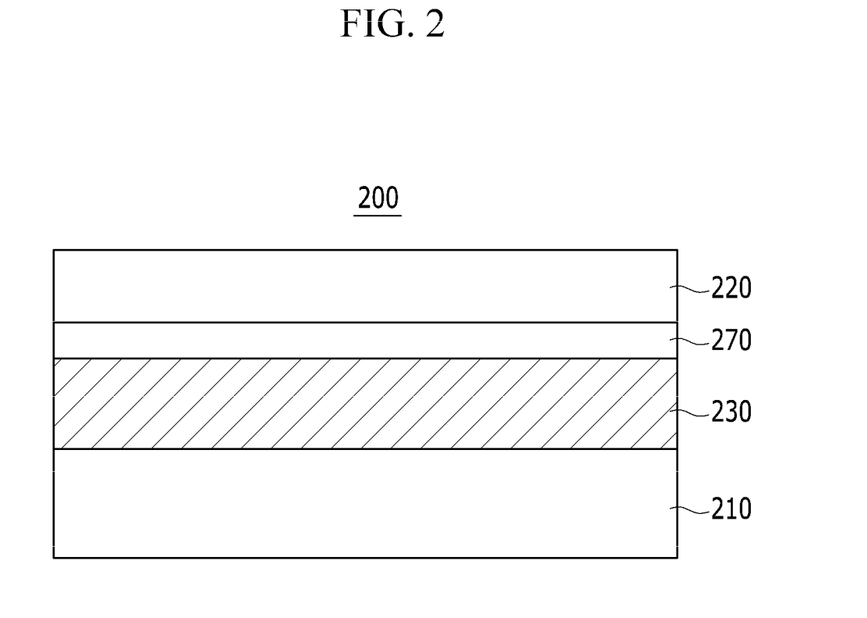
FIG. 2 is a cross-sectional view of an organic photoelectronic device according to at least one example embodiment.

Referring to FIG. 2, an organic photoelectronic device according to another example embodiment is described.

FIG. 2 is a cross-sectional view of an organic photoelectronic device according to another example embodiment.

Referring to FIG. 2, an organic photoelectronic device 200 according to an example embodiment includes a first light-transmitting electrode 220, a second light-transmitting electrode 210, and an active layer 230, similarly to the above-described example embodiment. However, the organic photoelectronic device 200 according to an example embodiment further includes a buffer layer 270 between the first light-transmitting electrode 220 and the active layer 230.

According to at least one example embodiment, the buffer layer 270 is positioned on one side of the first light-transmitting electrode 220, between the first light-transmitting electrode 220 and the active layer 230. According to an example embodiment, the buffer layer 270 directly contacts the first light-transmitting electrode 220. The buffer layer 270 may increase charge mobility between the active layer 230 and the first light-transmitting electrode 220 and contemporaneously or simultaneously protect the active layer 230 beneath the first light-transmitting electrode 220 during the sputtering process.

The buffer layer 270 may include an inorganic oxide, for example molybdenum oxide, tungsten oxide, tin oxide, vanadium oxide, rhenium oxide, niobium oxide, tantalum oxide, titanium oxide, nickel oxide, copper oxide, cobalt oxide, manganese oxide, chromium oxide, or a combination thereof.

The buffer layer 270 may be formed, for example, using thermal evaporation.

The buffer layer 270 may have a thickness of about 1 nm to about 50 nm. Within the above range, the buffer layer 270 may have a thickness of about 2 nm to about 30 nm.

Hereinafter, an organic photoelectronic device according to another example embodiment is described referring to FIG. 3.

Figure 3:
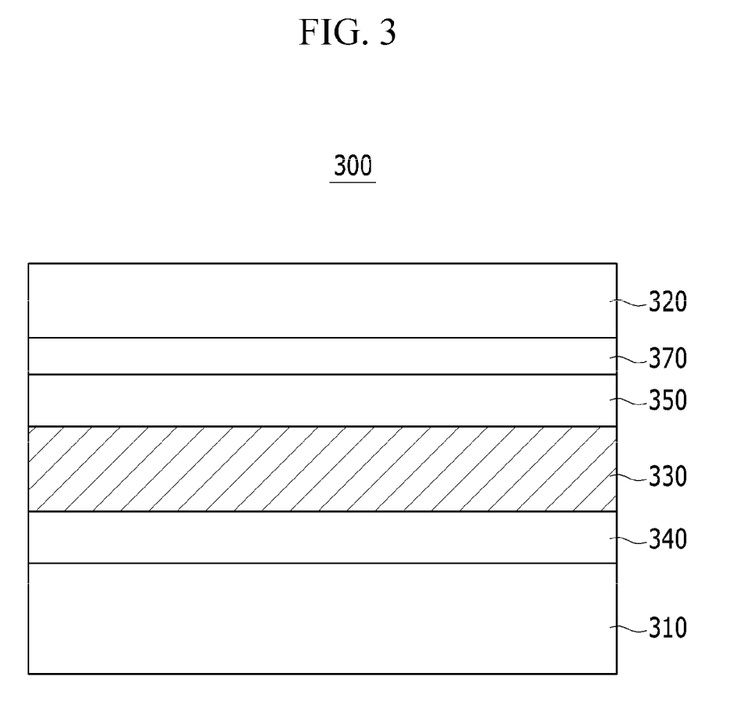
FIG. 3 is a cross-sectional view of an organic photoelectronic device according to at least one example embodiment.

FIG. 3 is a cross-sectional view of an organic photoelectronic device according to another example embodiment.

Referring to FIG. 3, an organic photoelectronic device 300 according to at least one example embodiment includes a first light-transmitting electrode 320, a second light-transmitting electrode 310, an active layer 330, and a buffer layer 370, similarly to the example embodiment illustrated in FIG. 2.

However, the organic photoelectronic device 300 according to an example embodiment further includes charge auxiliary layers 350 and 340, between the buffer layer 370 and active layer 330, and between the second light-transmitting electrode 310 and the active layer 330, respectively. The charge auxiliary layers 340 and 350 may facilitate the transfer of holes and electrons separated from the active layer 330, so as to increase efficiency.

The charge auxiliary layers 340 and 350 may be at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

The charge auxiliary layers 340 and 350 may include, for example, an organic material, an inorganic material, or an organic/inorganic material. The organic material may include an organic compound having hole or electron characteristics, and the inorganic material may be, for example, a metal oxide such as molybdenum oxide, tungsten oxide, nickel oxide, vanadium oxide ($V_2O_5$), rhenium oxide ($ReO_3$), and the like.

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), 1,4,5,8,9,11-hexaazatriphenylenehexacarbonitrile (HATCN), 1,1'-bis(4-bis(4-methyl-phenyl)-amino-phenyl)-cyclohexane (TAPC), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), 1,4,5,8,9,11-hexaazatriphenylenehexacarbonitrile (HATCN), 1,1'-bis-(4-bis(4-methyl-phenyI)-amino-phenyl)-cyclohexane (TAPC), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the charge auxiliary layers 340 and 350 may be omitted, according to an example embodiment.

The organic photoelectronic device may be applied to various fields, for example a solar cell, an image sensor, a photo-detector, a photo-sensor, and an organic light emitting diode (OLED), but is not limited thereto.

Hereinafter, an example of an image sensor including the organic photoelectronic device is described referring to drawings. As an example of an image sensor, an organic CMOS image sensor is described.

Figure 4:
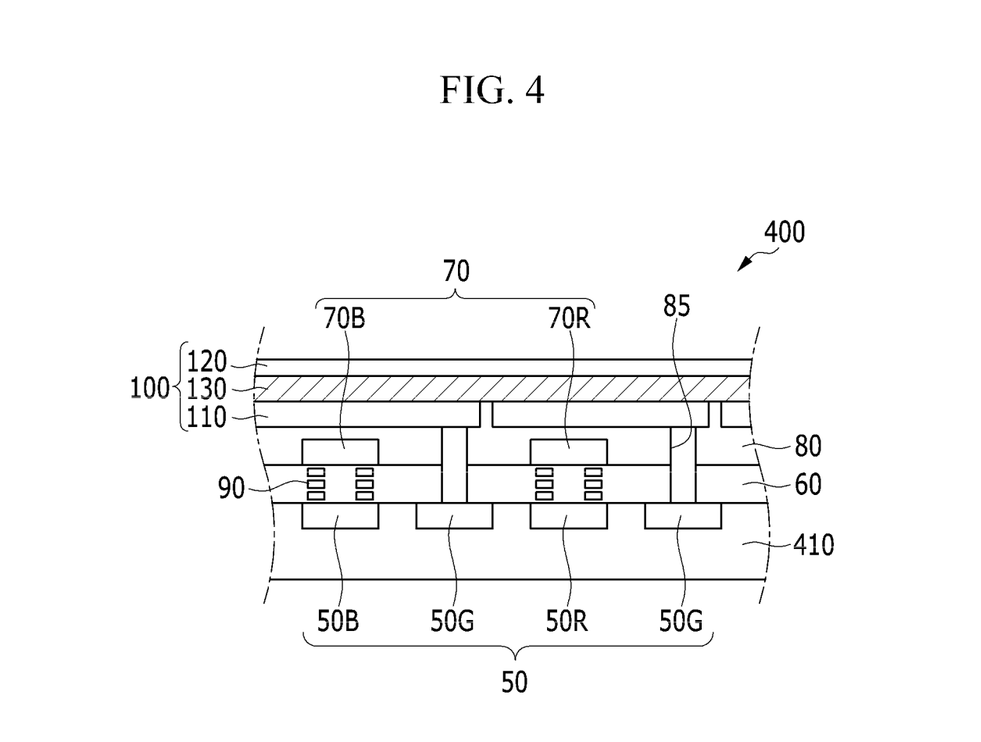
FIG. 4 is a cross-sectional view of an organic CMOS image sensor according to at least one example embodiment.

FIG. 4 is a cross-sectional view of an organic CMOS image sensor according to at least one example embodiment.

FIG. 4 describes blue, green, and red pixels that are adjacent to one another as an example, but is not limited thereto. Hereinafter, a constituent element including 'B' in the reference symbol refers to a constituent element included in the blue pixel, a constituent element including 'G' refers to a constituent element included in the green pixel, and a constituent element including 'R' in the reference symbol refers to a constituent element included in the red pixel.

Referring to FIG. 4, an organic CMOS image sensor 400 includes a semiconductor substrate 410 integrated with a photo-sensing device 50 and a transmission transistor (not shown), a lower insulation layer 60, a color filter 70, an upper insulation layer 80, and an organic photoelectronic device 100.

The semiconductor substrate 410 may be a silicon substrate, and may be integrated with the photo-sensing device 50 and the transmission transistor (not shown). The photo-sensing device 50 may be a photodiode, or may store charges generated in the organic photoelectronic device 100. The photo-sensing device 50 and the transmission transistor may be integrated in each pixel, and as shown in FIG. 4, the photo-sensing device 50 includes a blue pixel photo-sensing device 50B, a green pixel photo-sensing device 500, and a red pixel photo-sensing device 50R. The photo-sensing device 50 senses light, and the information sensed by the photo-sensing device 50 is transferred by the transmission transistor.

Metal wires 90 and pads (not shown) are formed on the semiconductor substrate 410. In order to decrease signal delay, the metal wires 90 and pads may be made of a metal having low resistivity, for example, aluminum (Al), copper (Cu), silver (Ag), and alloys thereof, but is not limited thereto.

The lower insulation layer 60 may be formed on the metal wires 90 and the pads. The lower insulation layer 60 may include, or be made of, an inorganic insulating material such as a silicon oxide and/or a silicon nitride, or a low dielectric constant (low K) material such as SiC, SiCOH, SiCO, and SiOF.

The lower insulation layer 60 may have a trench exposing each photo-sensing device 50B, 500, and 50R of each pixel. The trench may be filled with fillers.

According to at least one example embodiment, a color filter 70 is formed on the lower insulation layer 60. The color filter 70 includes a blue filter 70B formed in the blue pixel and a red filter 70R formed in the red pixel. In an example embodiment, a green filter is not included, but a green filter may be further included.

According to at least one example embodiment, the upper insulation layer 80 is formed on the color filter 70. The upper insulation layer 80 eliminates a step caused by the color filters 70 and planarizes or contributes to smoothing the surface. The upper insulation layer 80 and lower insulation layer 60 may include a contact hole (not shown) exposing a pad, and a penetration hole 85 exposing the photo-sensing device 500 of a green pixel.

According to at least one example embodiment, the organic photoelectronic device 100 is formed on the upper insulation layer 80. The organic photoelectronic device 100 includes the first light-transmitting electrode 120, the active layer 130, and the second light-transmitting electrode 110, as described above.

According to at least one example embodiment, the active layer 130 includes a p-type semiconductor material and an n-type semiconductor material that selectively absorb light in a green wavelength region as described above, and that photoelectrically convert.

When light enters from the first light-transmitting electrode 120, the light in a green wavelength region may be mainly absorbed in the active layer active layer 130 and photoelectrically converted, while the light in the rest of the wavelength regions passes through the second light-transmitting electrode 110 and may be sensed in a photo-sensing device 50.

Figure 5:
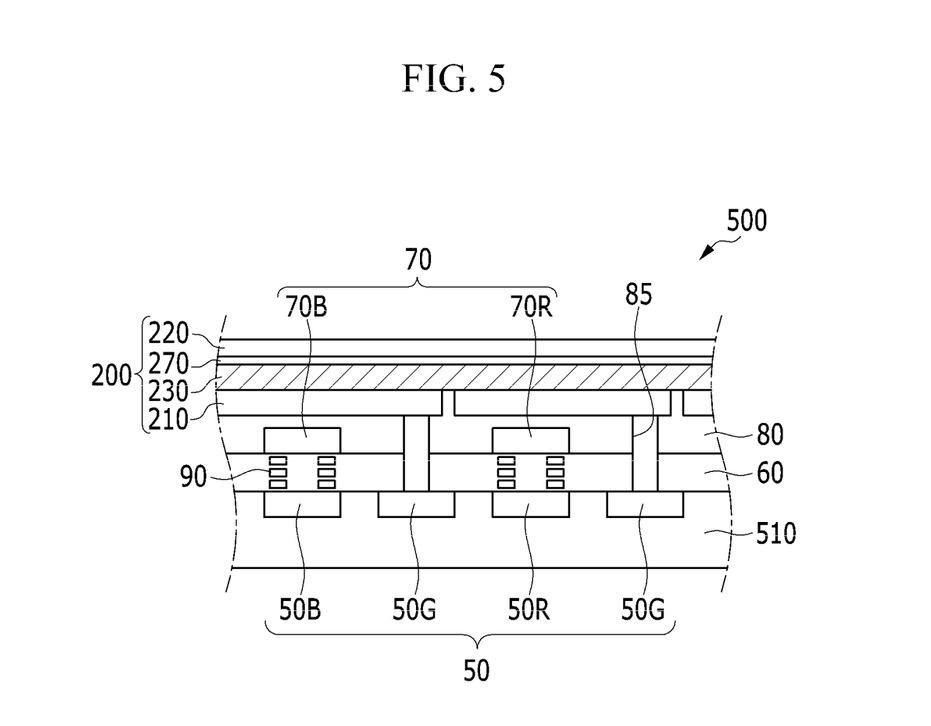
FIG. 5 is a cross-sectional view of an organic CMOS image sensor according to at least one example embodiment.

FIG. 5 is cross-sectional view of an organic CMOS image sensor according to at least one example embodiment.

Referring to FIG. 5, an organic CMOS image sensor 500 according to an example embodiment includes a semiconductor substrate 510 integrated with a photo-sensing device 50 and a transmission transistor (not shown), a lower insulation layer 60, a color filter 70, and an upper insulation layer 80, similarly to the example embodiment illustrated in FIG. 4. However, the organic CMOS image sensor 500 includes the organic photoelectronic device 200 including the buffer layer 270 instead of the organic photoelectronic device 100 illustrated in FIG. 4.

Figure 6:
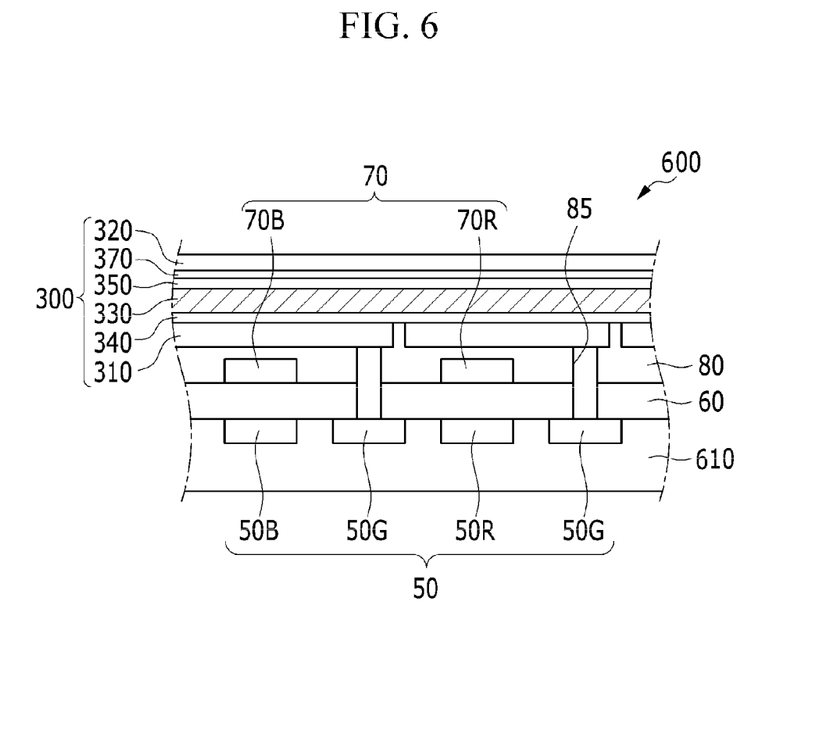
FIG. 6 is a cross-sectional view of an organic CMOS image sensor according to at least one example embodiment.

FIG. 6 is cross-sectional view of an organic CMOS image sensor according to at least one example embodiment.

Referring to FIG. 6, an organic CMOS image sensor 600 according to at least one example embodiment includes a semiconductor substrate 610 integrated with a photo-sensing device 50 and a transmission transistor (not shown), a lower insulation layer 60, a color filter 70, and an upper insulation layer 80. However, the organic CMOS image sensor 600 includes an organic photoelectronic device 300 including charge auxiliary layers 340 and 350 instead of the organic photoelectronic device 200 illustrated in FIG. 5.

Figure 7:
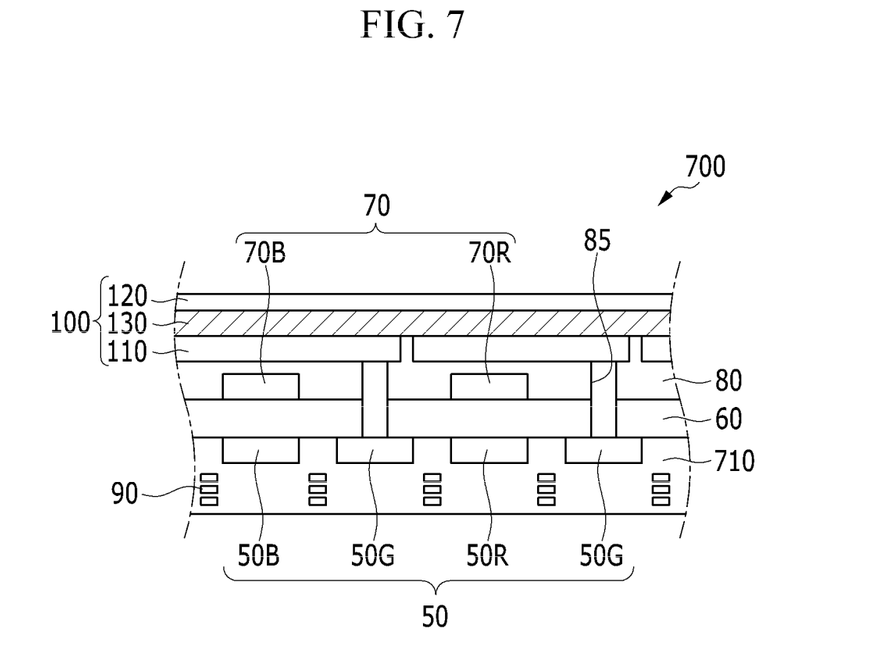
FIG. 7 is a cross-sectional view of an organic CMOS image sensor according to at least one example embodiment.

FIG. 7 is cross-sectional view of an organic CMOS image sensor according to at least one example embodiment.

Referring to FIG. 7, an organic CMOS image sensor 700 according to at least one example embodiment includes a semiconductor substrate 710 integrated with a photo-sensing device 50 and a transmission transistor (not shown), a lower insulation layer 60, a color filter 70, and an upper insulation layer 80. However, the metal wire 90 may be positioned beneath the photo-sensing device 50, unlike the configuration of the example embodiment illustrated in FIG. 4. When the metal wire 90 is positioned beneath the photo-sensing device 50, light loss due to reflection of the metal wire 90 made of an opaque metal decreases, light efficiency increases, and light interference among pixels may be effectively reduced.

FIG. 7 shows an organic photoelectronic device 100, but the example embodiments are not limited thereto, and may be applied to the above organic photoelectronic device 200 or 300 instead of the organic photoelectronic device 100.

Figure 8:
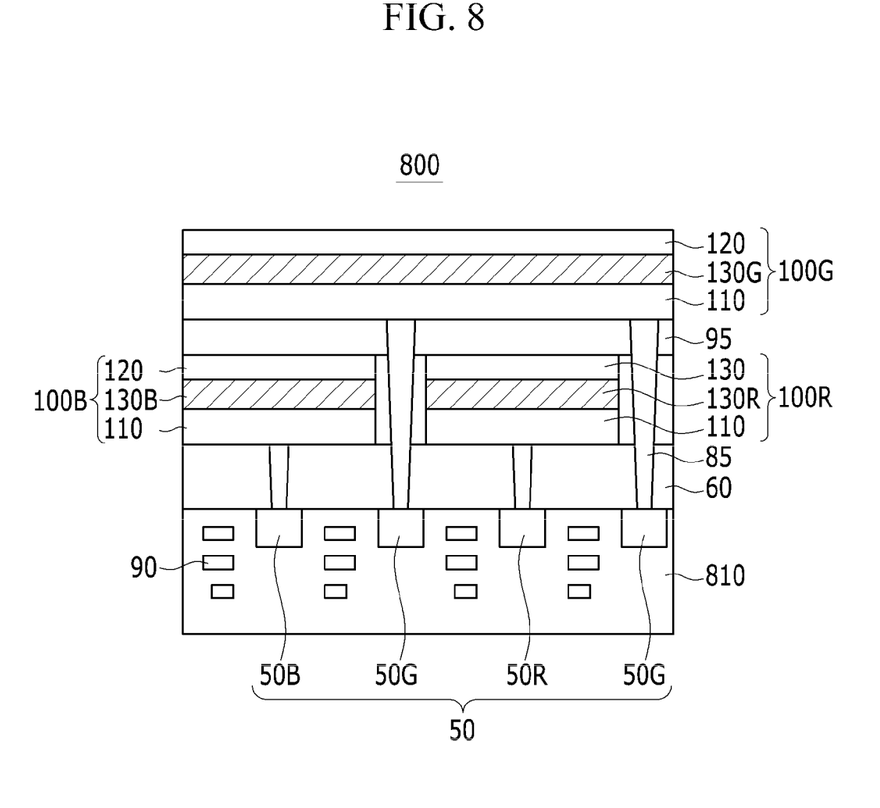
FIG. 8 is a cross-sectional view of an organic CMOS image sensor according to at least one example embodiment.

FIG. 8 is cross-sectional view of an organic CMOS image sensor according to at least one example embodiment.

Referring to FIG. 8, an organic CMOS image sensor 800 according to at least one example embodiment includes a first organic photoelectronic device 100G, a second organic photoelectronic device 100R, and a third organic photoelectronic device 100B absorbing light in different wavelength regions.

According to at least one example embodiment, the first organic photoelectronic device 100G includes an active layer 130G selectively absorbing light of a green wavelength region, the second organic photoelectronic device 100R includes an active layer 130R selectively absorbing the light of a red wavelength region, and the third organic photoelectronic device 100B includes an active layer 130B selectively absorbing light of a blue wavelength region. Accordingly, the organic photoelectronic devices may selectively absorb light for predetermined wavelength regions without the need for a separate color filter.

According to at least one example embodiment, the first organic photoelectronic device 100G may be positioned on the second organic photoelectronic device 100R and the third organic photoelectronic device 100B, and the second organic photoelectronic device 100R and the third organic photoelectronic device 100B may be parallel to each other.

An insulation layer 95 may be formed between the first organic photoelectronic device 100G and the second organic photoelectronic device 100R, and between the first organic photoelectronic device 100G and the third organic photoelectronic device 100B.

The first organic photoelectronic device 100G may be electrically connected to a photo-sensing device 500 of a green pixel, the second organic photoelectronic device 100R may be electrically connected to a photo-sensing device 50R of a red pixel, and the third organic photoelectronic device 100B may be electrically connected to a photo-sensing device 50B of a blue pixel.

The metal wire 90 may be positioned beneath the photo-sensing device 50. However, the metal wire 90 is not limited thereto, and may be positioned on the photo-sensing device 50.

FIG. 8 shows an organic photoelectronic device 100, but the example embodiments are not limited thereto, and may be applied to the organic photoelectronic devices 200 or 300 described above instead of the organic photoelectronic device 100.

Hereinafter, the example embodiments are illustrated in more detail with reference to examples. However, the present disclosure is not limited thereto.

EXAMPLE MANUFACTURE OF ORGANIC PHOTOELECTRONIC DEVICE

Example 1

A lower electrode that is about 100 nm-thick is formed by sputtering ITO on a glass substrate. Subsequently, a 5 nm-thick lower charge auxiliary layer is formed on the lower electrode by thermally evaporating molybdenum oxide ($MoO_x$, $0<x≤3$) and aluminum (Al) in a ratio of 1:1 (wt/wt). Subsequently, an active layer is formed on the lower charge auxiliary layer by sequentially depositing dicyanovinyl-ter-thiophene (DCV3T) to be 10 nm thick, dicyanovinyl-ter-thiophene (DCV3T):N,N'-dimethylquinacridone (DMQA) in a ratio of 1:1 to be 110 nm thick, HT211 to be 10 nm thick, and HT211 and NPD9 in a ratio of 1:1 to be 15 nm thick through thermal evaporation. Subsequently, a 6 nm-thick upper electrode is formed on the active layer by sputtering ITO at a speed of 0.6 Å/s for 100 seconds (DC: 250 W, chamber pressure: 1 mTorr, Ar: 5 sccm, $O_2$: 0.2 sccm), manufacturing an organic photoelectronic device.

Example 2

An organic photoelectronic device is manufactured according to the same example method as in Example 1, except for additionally forming a buffer layer by thermally evaporating molybdenum oxide ($MoO_x$, $0<x≤3$) to be about 10 nm thick before forming the upper electrode.

Example 3

An organic photoelectronic device is manufactured according to the same example method as Example 1, except for additionally forming a buffer layer by thermally evaporating tungsten oxide ($WO_x$, $0<x≤3$) to be about 10 nm thick before forming the upper electrode.

Comparative Example 1

An organic photoelectronic device is manufactured according to the same example method as Example 2, except for forming a 12.5 nm-thick upper electrode by thermally evaporating silver (Ag) instead of the ITO upper electrode.

Evaluation

Evaluation 1: Transmittance

Transmittance of the organic photoelectronic devices according to Examples 1 to 3 and Comparative Example 1 is evaluated.

The transmittance is measured by using an UV-visible spectrophotometer (Ocean Optics).

Figure 9:
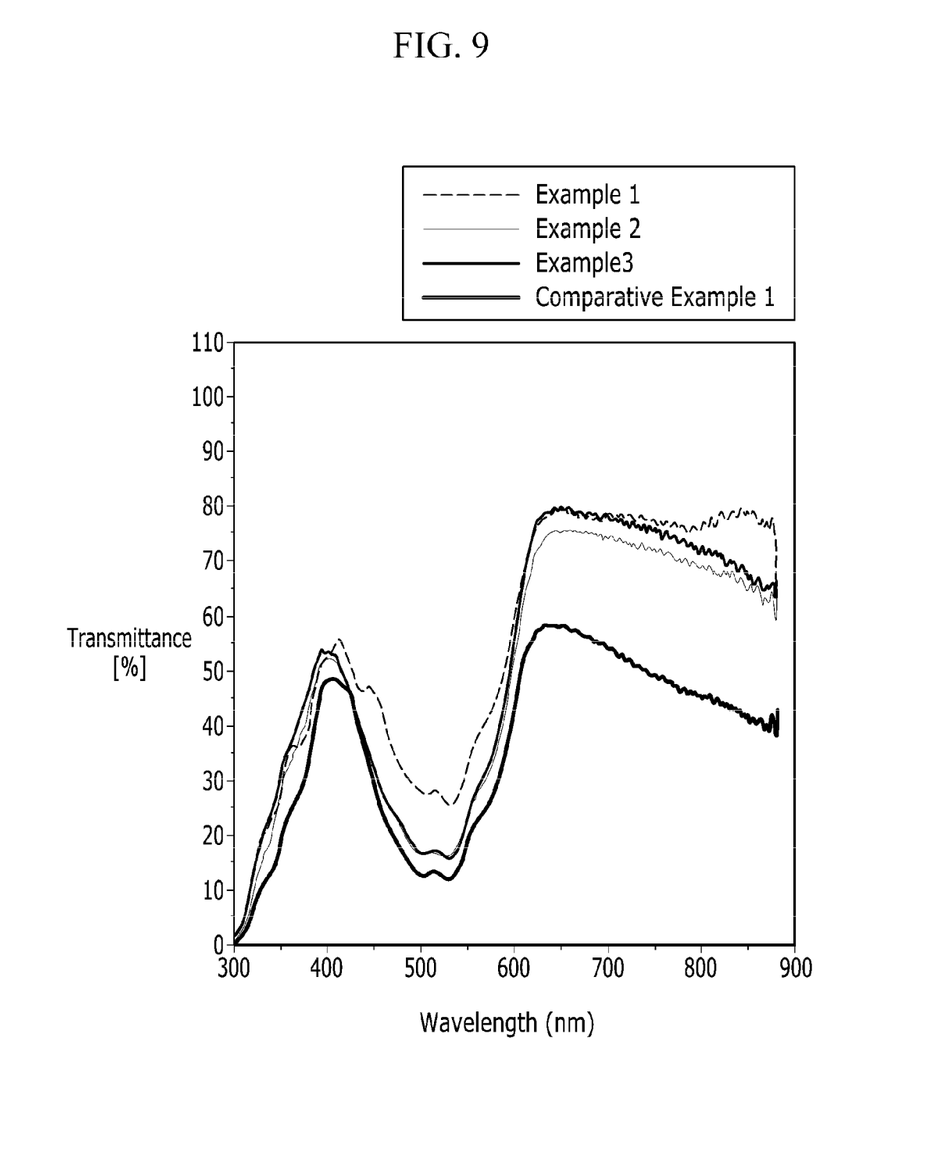
FIG. 9 is a graph showing transmittance depending on wavelengths of the photoelectronic devices according to Examples 1 to 3 and Comparative Example 1.

The results are provided in FIG. 9.

FIG. 9 is a graph showing transmittance depending on wavelengths of the photoelectronic devices according to Examples 1 to 3 and Comparative Example 1.

Referring to FIG. 9, the organic photoelectronic devices according to Examples 1 to 3 show clearly improved transmittance effects, especially in a long wavelength region of greater than or equal to about 600 nm compared with the organic photoelectronic device according to Comparative Example 1.

In FIG. 9, the active layers selectively absorbing light of a green wavelength region absorb light of a green wavelength region ranging from about 450 to 600 nm and bring about low transmittance.

Evaluation 2: External Quantum Efficiency

The external quantum efficiency (EQE) of the organic photoelectronic devices according to Examples 1 to 3 is evaluated.

The external quantum efficiency (EQE) is measured by using an IPCE measurement system (McScience Inc., Korea). First, after the IPCE measurement system is calibrated by using a Si photodiode (Hamamatsu Photonics K.K., Japan), the organic photoelectronic devices according to Examples 1 to 3 are mounted in the system, and external quantum efficiency of the organic photoelectronic devices in a wavelength ranging from about 400 to 700 nm is measured. Herein, a bias is 3 V.

Figure 10:
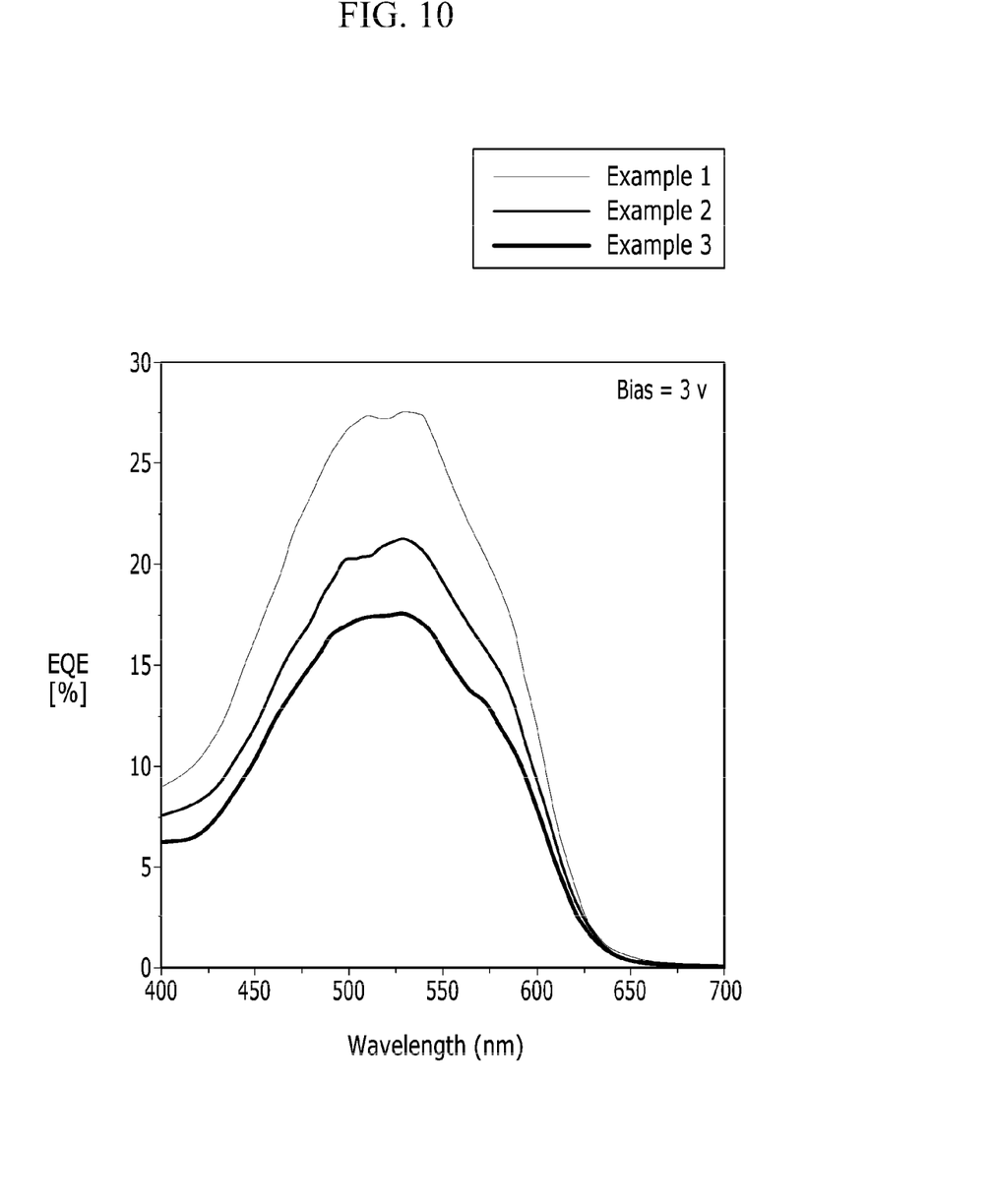
FIG. 10 is a graph showing external quantum efficiency (EQE) depending on wavelengths of the photoelectronic devices according to Examples 1 to 3.

The results are provided in FIG. 10.

FIG. 10 is a graph showing external quantum efficiency (EQE) depending on wavelengths of the photoelectronic devices according to Examples 1 to 3.

Referring to FIG. 10, the organic photoelectronic devices according to Examples 1 to 3 show good external quantum efficiency (EQE) in a green wavelength region ranging from about 450 to 600 nm. In particular, the organic photoelectronic devices further including a buffer layer according to Examples 2 and 3 show much better external quantum efficiency (EQE) in a green wavelength region ranging from about 450 to 600 nm.

Evaluation 3: Dark Current

Dark current of the organic photoelectronic devices according to Examples 1 to 3 is evaluated.

The dark current is evaluated by applying a reverse bias to the organic photoelectronic device according to Examples 1 to 3, and measuring their current change depending on a voltage.

Figure 11:
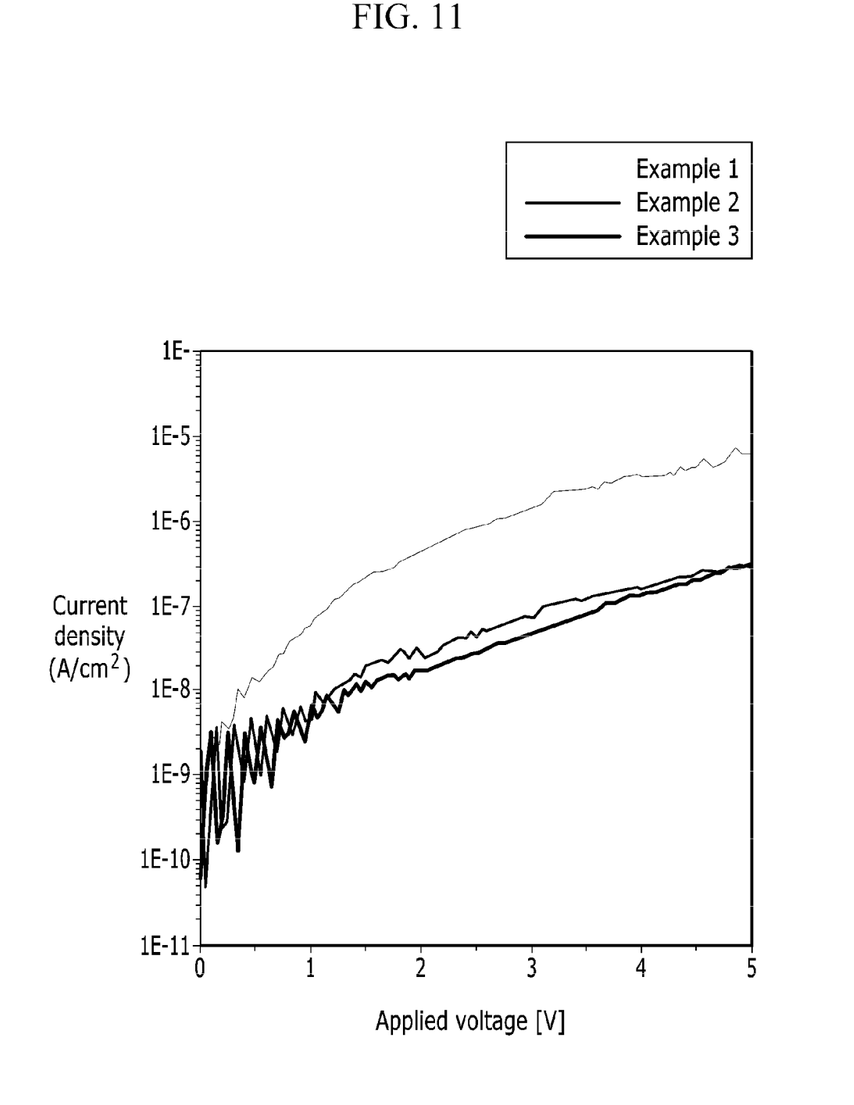
FIG. 11 is a graph showing dark currents of the photoelectronic devices according to Examples 1 to 3.

The results are provided in FIG. 11.

FIG. 11 is a graph showing dark currents of the photoelectronic devices according to Examples 1 to 3.

Referring to FIG. 11, the organic photoelectronic devices according to Examples 1 to 3 show good dark current. In particular, the organic photoelectronic devices further including a buffer layer according to Examples 2 and 3 show much better dark current.

While this disclosure has been described in connection with example embodiments, it is to be understood that the invention is not limited to the disclosed example embodiments, but, on the contrary, is intended to cover various modifications and equivalent arrangements included within the spirit and scope of the appended claims.

What is claimed is:

1. An organic photoelectronic device, comprising:
   a first light-transmitting electrode;
   an active layer on the first light-transmitting electrode;
   a second light-transmitting electrode on the active layer, and
   a buffer layer between the first light-transmitting electrode and the active layer,
   wherein the first light-transmitting electrode and the second light-transmitting electrode independently comprises at least one of indium tin oxide (ITO), indium zinc oxide (IZO), tin oxide (SnO), aluminum tin oxide (ATO), aluminum zinc oxide (AZO), and fluorine-doped tin oxide (FTO),
   wherein the buffer layer and the first light-transmitting electrode are in contact with each other, and the buffer layer comprises at least one of molybdenum oxide, tungsten oxide, tin oxide, vanadium oxide, rhenium oxide, niobium oxide, tantalum oxide, titanium oxide, nickel oxide, copper oxide, cobalt oxide, manganese oxide, and chromium oxide.

2. The organic photoelectronic device of claim 1, wherein the first light-transmitting electrode is at a light incidence side.

3. The organic photoelectronic device of claim 2, wherein the first light-transmitting electrode has a thickness of about 1 nm to about 100 nm.

4. The organic photoelectronic device of claim 3, wherein the first light-transmitting electrode has a thickness of about 2 nm to about 10 nm.

5. The organic photoelectronic device of claim 1, wherein the buffer layer has a thickness of about 1 nm to about 30 nm.

6. The organic photoelectronic device of claim 1, wherein the active layer is configured to selectively absorb light of a green wavelength region.

7. The organic photoelectronic device of claim 6, wherein the active layer comprises:
   a p-type semiconductor material having a maximum absorption peak in a wavelength region of about 500 nm to about 600 nm, and
   an n-type semiconductor material having a maximum absorption peak in a . wavelength region of about 500 nm to about 600 nm.

8. An image sensor comprising a green pixel, a red pixel, and a blue pixel,
   wherein the green pixel comprises
   the organic photoelectronic device of claim 6 and
   a green photo-sensing device electrically connected to the organic photoelectronic device;
   the red pixel comprises a red filter and a red photo-sensing device; and
   the blue pixel comprises a blue filter and a blue photo-sensing device.

9. The image sensor of claim 8, further comprising a metal wire positioned on one or more of the green photo-sensing device, the red photo-sensing device, and the blue photo-sensing device.

10. The image sensor of claim 8, further comprising a metal wire positioned under one or more of the green photo-sensing device, the red photo-sensing device, and the blue photo-sensing device.

11. An image sensor comprising a green pixel, a red pixel, and a blue pixel,
   wherein the green pixel comprises
   a first organic photoelectronic device as in claim 6 and
   a green photo-sensing device electrically connected to the first organic photoelectronic device,
   the red pixel comprises
   a second organic photoelectronic device having a second active layer configured to selectively absorb light of a red wavelength region and
   a red photo-sensing device electrically connected to the second organic photoelectronic device, and
   the blue pixel comprises
   a third organic photoelectronic device having a third active layer configured to selectively absorb light of a blue wavelength region and
   a blue photo-sensing device electrically connected to the third organic photoelectronic device.

12. The image sensor of claim 11, wherein the first organic photoelectronic device is on the second organic photoelectronic device and the third organic photoelectronic device.

13. The image sensor of claim 11, further comprising a metal wire positioned on one or more of the green photo-sensing device, the red photo-sensing device, and the blue photo-sensing device.

14. The image sensor of claim 11, further comprising a metal wire positioned under one or more of the green photo-sensing device, the red photo-sensing device, and the blue photo-sensing device.

15. The organic photoelectronic device of claim 1, wherein the active layer is configured to selectively absorb light of a red wavelength region.

16. The organic photoelectronic device of claim 1, wherein the active layer is configured to selectively absorb light of a blue wavelength region.

17. An image sensor comprising the organic photoelectronic device of claim 1.

* * * * *